United States Patent
Albers et al.

(10) Patent No.: US 10,655,211 B2
(45) Date of Patent: May 19, 2020

(54) TOOL WITH MULTI-LAYER ARC PVD COATING

(71) Applicant: WALTER AG, Tübingen (DE)

(72) Inventors: Ulrich Albers, Starzach-Börstingen (DE); Veit Schier, Echterdingen (DE)

(73) Assignee: Walter AG, Tubingen (DE)

( * ) Notice: Subject to any disclaimer, the term of this patent is extended or adjusted under 35 U.S.C. 154(b) by 138 days.

(21) Appl. No.: 15/575,434

(22) PCT Filed: May 19, 2016

(86) PCT No.: PCT/EP2016/061235
§ 371 (c)(1),
(2) Date: Apr. 9, 2018

(87) PCT Pub. No.: WO2016/184954
PCT Pub. Date: Nov. 24, 2016

(65) Prior Publication Data
US 2018/0223415 A1 Aug. 9, 2018

(30) Foreign Application Priority Data
May 21, 2015 (EP) ..................... 15168747

(51) Int. Cl.
C23C 14/06 (2006.01)
C23C 14/32 (2006.01)
(Continued)

(52) U.S. Cl.
CPC ........ C23C 14/325 (2013.01); C23C 14/0641 (2013.01); C23C 14/5873 (2013.01);
(Continued)

(58) Field of Classification Search
USPC ................ 428/212, 216, 336, 697, 698, 699
See application file for complete search history.

(56) References Cited

U.S. PATENT DOCUMENTS 7,537,822 B2 * 5/2009 Ishikawa ................. C23C 14/06
428/212
2006/0222893 A1 * 10/2006 Derflinger ........... C23C 14/0641
428/698

(Continued)

FOREIGN PATENT DOCUMENTS

CN 101879794 11/2010
EP 1939327 7/2008
(Continued)

OTHER PUBLICATIONS

"Deposition of Superhard Nanolayered TiCrAlSiN Thin Films by Cathodic Arc Plasma Deposition"; Kim, Sun Kyu, et al; Surface & Coatings Technology; Elsevier Publishers; Jun. 6, 2008; pp. 5395-5399.

Primary Examiner — Archene A Turner
(74) Attorney, Agent, or Firm — Corinne R. Gorski

(57) ABSTRACT

A tool includes a base body of hard metal, cermet, ceramics, steel or high speed steel and a multi-layer wear protection coating deposited thereon by a PVD process. The wear protection coating has a first coat deposited on the base body having a composition of $Ti_aAl_{(1-a)}N$, wherein $0.4 \leq a \leq 0.6$, and a coating thickness of 0.5 μm to 4 μm, and a second coat deposited on the first coat. The second coat includes a sequence of 10 to 80 first and second layers alternatingly arranged one on top of each other. Each of the first and second layers has a thickness of 5 to 100 nm. Each first layer includes nitrides of the elements Ti, Al, Cr and Si, and each second layer has a composition of $Ti_xAl_{(1-x)}N$, wherein $0.4 \leq x \leq 0.6$. The first and second coats have up to 10 at-% of further metals, B, C and/or O as impurities in each layer.

14 Claims, 2 Drawing Sheets

Figure 1:
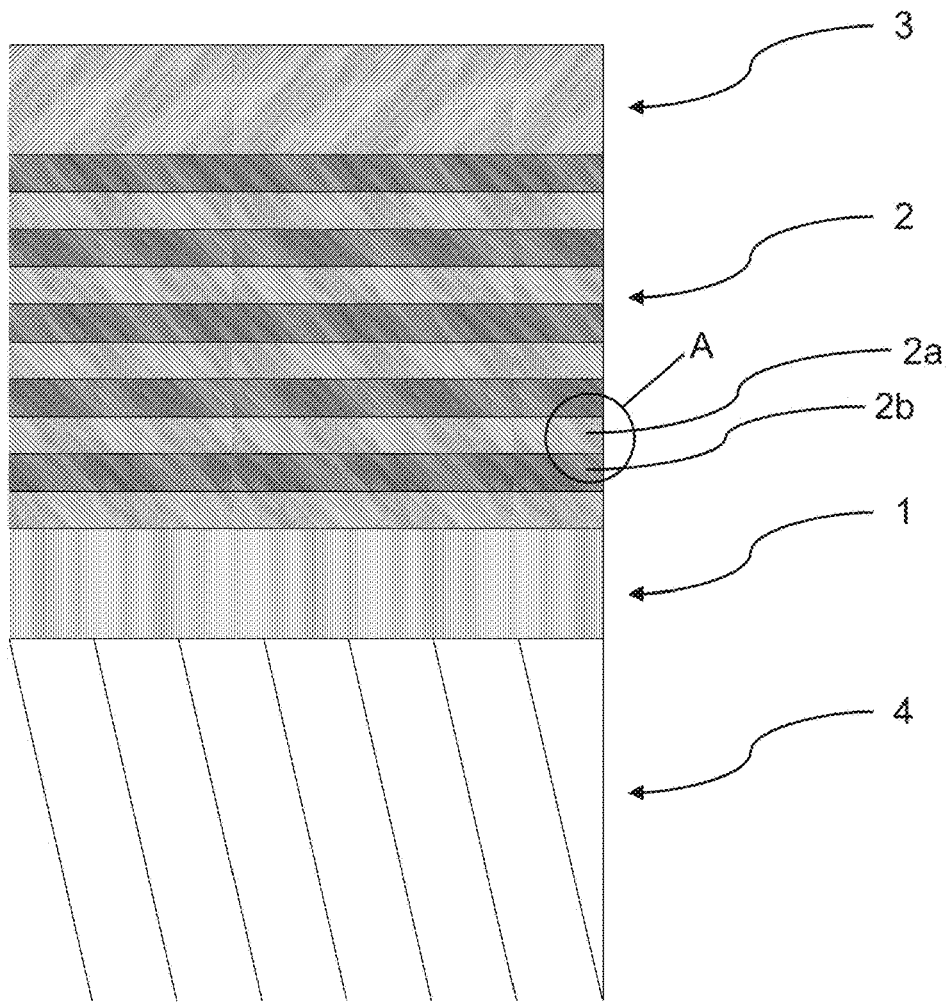
Figure 1:
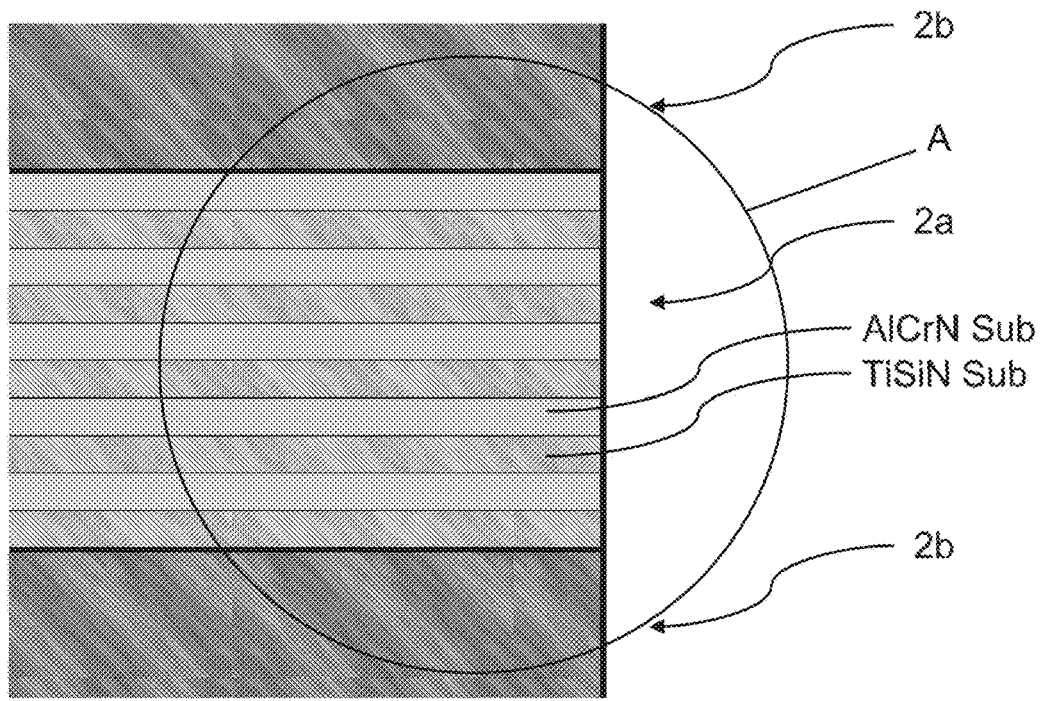

(51) Int. Cl.
    *C23C 14/58* (2006.01)
    *C23C 28/04* (2006.01)
    *C23C 28/00* (2006.01)
    *C22C 29/08* (2006.01)

(52) U.S. Cl.
    CPC ........ *C23C 14/5886* (2013.01); *C23C 28/042* (2013.01); *C23C 28/044* (2013.01); *C23C 28/42* (2013.01); *C22C 29/08* (2013.01)

(56) References Cited

U.S. PATENT DOCUMENTS

| | | | |
|---|---|---|---|
| 2008/0166583 A1* | 7/2008 | Astrand | C23C 14/0641 428/602 |
| 2011/0135898 A1* | 6/2011 | Bohlmark | C23C 14/00 428/336 |
| 2011/0171444 A1 | 7/2011 | Elkouby | |
| 2011/0311837 A1 | 12/2011 | Okuhira | |
| 2013/0108850 A1* | 5/2013 | Kudo | C04B 35/5831 428/216 |
| 2015/0232978 A1* | 8/2015 | Schier | C23C 30/005 428/216 |

FOREIGN PATENT DOCUMENTS

| | | | |
|---|---|---|---|
| JP | 2008-188689 | * | 8/2008 |
| JP | 2014069258 | | 4/2014 |
| WO | 2006102780 | | 10/2006 |
| WO | 2014/049105 | | 4/2014 |

\* cited by examiner

TOOL WITH MULTI-LAYER ARC PVD COATING

RELATED APPLICATION DATA

This application is a § 371 National Stage Application of PCT International Application No. PCT/EP2016/061235 filed May 19, 2016 claiming priority to EP Application No. 15168747.2 filed May 21, 2015.

The invention relates to a tool with a main body made of hard metal, cermet, ceramic, steel or high-speed steel, and a multi-layer wear protection coating applied thereon by the PVD process. The wear protection coating comprises a first TiAlN coat and a second multi-layer coat above comprising the nitrides of the elements Ti, Al, Cr and Si. The invention further relates to a process for manufacturing the inventive tool, as well as the use thereof.

BACKGROUND OF THE INVENTION

Cutting tools, in particular tools for chip-forming metal machining, consist of a main body which is made for example of hard metal, cermet, ceramic, steel or high-speed steel. To increase the tool life or to improve the cutting properties, a single-layer or multi-layer wear protection coating made of hard materials is frequently applied to the main body by means of CVD or PVD processes. The PVD processes come in a number of different variants, such as magnetron sputtering, arc vapor deposition (arc PVD), ion plating, electron beam vapor deposition and laser ablation. Magnetron sputtering and arc vapor deposition are the PVD processes which are used most often for coating of tools. Individual PVD process variants, in turn, include a variety of modifications such as for example unpulsed or pulsed magnetron sputtering or unpulsed or pulsed arc vapor deposition, etc.

In arc vapor deposition (arc PVD) the arc generates very high temperatures in the order of several thousand degrees celsius at the target resulting in the desired evaporation or sublimation, respectively, of the target material for a deposition on the substrate. Around the point of impact of the arc areas of lower temperatures are generated, such as for example in the region from 500 to 1,000° C., where in some target metals, particularly low melting metals, such as aluminum, there occurs detachment of macro-particles, so called droplets, which are also co-deposited on the substrate. Such droplets lead to undesired roughness of the deposited coating compared to coatings produced for example by magnetron sputtering. In addition, the droplets result in a weakening of the coating, because in general they predominantly consist of pure metal and thereby exhibit a lower hardness and increased tendency for oxidation. It is therefore desired to reduce the droplet formation in the PVD arc vapor deposition process.

For specific metal machining operations, such as for example milling, turning and drilling, there exist particularly high demands on the tool. Important parameters for such tools are high hardness, high modulus of elasticity (E-modulus, Young's modulus) and a low surface roughness. Known cutting tools for the described applications comprise TiAlN coatings deposited in a PVD process, which typically have a modulus of elasticity below 400 GPa and a Vicker's hardness up to 3,500 HV. If such TiAlN coatings are deposited by the arc vapor deposition process, they have a tendency for the formation of droplets on and in the coating due to the low melting temperature of the aluminum, which has a disadvantageous effect on the performance of the coating. By appropriate selection of the parameters of the deposition process the hardness and the modulus of elasticity of PVD coatings can be increased, however, in general, this leads to high residual compressive stresses in the coating in the order significantly above 3 GPa, which have disadvantageous effects on the stability of the cutting edge. Under high load such a cutting edge tends to early chipping, and thereby, to a rapid wear of the tool.

There are commercially available tools having a PVD coating comprising a first multi-layer coat of TiN and TiAlN and a second multi-layer coat of TiSeN and AlCrN. The coating is deposited by two subsequent deposition processes to achieve a high coating thickness. After the deposition of the first multi-layer coat in a first deposition process the coated substrate is cooled down and subjected to a mechanical treatment wherein the residual compressive stresses of the first coat are changed, before the second multi-layer coat is then deposited in a further deposition process. The coating exhibits a high hardness, but, at the same time, also very high residual compressive stresses significantly above 3 GPa, which has a disadvantageous effect on the stability of the cutting edge, the uniform covering of the cutting edge and the performance of the tools.

WO 2006/041367 A1 describes a coated cutting tool consisting of a hard metal substrate and a coating which is deposited in the PVD process and comprises at least one coat of TiAlN having a thickness of 1.5 to 5 µm and a residual compressive stress >4 to 6 GPa. The TiAlN coat is said to adhere more effectively to the substrate compared with known coats. The very high residual compressive stresses have, however, a disadvantageous effect on the stability of the cutting edge.

EP 2 298 954 A1 describes a method for producing a coated cutting tool wherein a hard material coating, for example TiAlN or TiAlCrN, is applied to a substrate by the PVD process, and wherein the bias voltage of the substrate being varied during the deposition process. The method is said to provide an improved wear resistance and a longer service life of the tool.

OBJECT

The object of the present invention was to provide a coated tool for the chip forming machining of materials, particularly drilling of iron materials, such as cast iron, unalloyed and low alloyed steels, having improved cutting properties and improved resistance against tribochemical wear, as well as high hardness, high fracture toughness, high modulus of elasticity and good high temperature resistance of the coating compared to the prior art.

A further object of the invention was to provide a process for the production of a PVD coating on a tool of the invention wherein in the coating of the substrate by arc vapor deposition, compared to the prior art, the formation of droplets is reduced and, thus, improved properties of the tool are achieved and a lower post-treatment effort is required to smoothen the surfaces subsequently to the coating to achieve a condition suitable for the chip forming metal machining.

DESCRIPTION OF THE INVENTION

This object is solved by a tool comprising a base body (4) made of hard metal, cermet, ceramics, steel or high-speed steel and a multi-layer wear protective coating deposited on the base body by means of the PVD process, characterized in that the wear protective coating comprises the following coats:

a) a first coat (1) deposited on the base body and having the composition $Ti_aAl_{(1-a)}N$ wherein $0.4 \leq a \leq 0.6$ and a coating thickness of 0.5 µm to 4 µm, b) a second coat (2) deposited on the first coat and consisting of a sequence of 10 to 80 of each of first layers (2a) and second layers (2b) being alternatingly arranged on top of each other, wherein each of the first and second layers (2a, 2b) has a layer thickness of from 5 nm to 100 nm, wherein the first layer (2a) comprises the nitrides of the elements Ti, Al, Cr and Si, and wherein the second layer (2b) has the composition of $Ti_xAl_{(1-x)}N$ wherein $0.4 \leq x \leq 0.6$, wherein the wear protection coating can comprise a further hard material coats above the second coat (2), and wherein the first and second coats due to the manufacturing method can comprise up to 10 at-% of further metals, B, C and/or O as impurities in each layer.

Reference numerals, herein placed in brackets, for illustrative purposes refer to the attached exemplary schematic representation in FIG. 1 of a coating of the invention.

Advantageously, the PVD process by which the multilayer wear protection coating is applied to the tool substrate is arc vapor deposition (arc PVD). However, other PVD processes are also applicable, whereby a coating deposited by arc vapor deposition has advantages over coatings deposited by other processes. In arc vapor deposition the evaporated atoms are highly ionized. The ions provide for a very good adhesion of the coating on the substrate and introduce a lot of energy during growth of the coat resulting in the generation of very dense coats having very good mechanical properties. The process of arc vapor deposition itself is comparably reliable and well established, and, among others, it puts significantly lower demands on the vacuum system and its periphery than, for example, sputtering processes, such as for example the HIPIMS process The inventive tool is characterized by particularly advantageous cutting properties and wear resistance, as well as high tool lives in the chip forming operation, particularly in drilling operations of materials of the application group ISO-P (tough iron materials, unalloyed and low alloyed steels) and materials of the application group ISO-K (cast iron). Compared to the prior art, it exhibits improved cutting properties and a hardness with, at the same time, high stability and integrity of the cutting edge. Furthermore, it is highly resistant against tribochemical wear, and it exhibits very good fracture toughness and high temperature resistance. The coating of the inventive tools can be carried out in a single PVD process by arc vapor deposition without the need to interrupt the process between the deposition of coats, particularly the first and second coats, for example to cool down the deposited coats and to subject them an intermediate treatment, which is a significant economical advantage of the manufacturing process.

Furthermore, compared to tools that also have aluminum-containing coatings deposited by arc vapor deposition, the inventive tool exhibits a lower number of droplets after the coating so that the post-treatment effort by smoothening the surfaces after the coating is comparably low to achieve a condition suitable for the chip forming metal machining. This is another significant economical advantage of the present invention over the prior art. However, a post-treatment of the surface of the inventive tool to remove still present droplets is recommended, particularly for solid hard metal twist drills, to improve the chip removal in the flute of the drilling tool. Furthermore, a post-treatment by blasting procedures can, in addition to smoothening the surface, further introduce residual compressive stresses into the coating and, as the case may be, also into the substrate, whereby a further improvement of the performance of the tool can be achieved.

In a preferred embodiment of the invention the first coat (1) of the inventive coating consists of a single layer. Independent whether the first coat is a single layer or multi-layer, according to the invention it has a layer thickness in the range of from 0.5 to 4 µm, preferably of from 1 to 3 µm, particularly preferably of from 1.5 to 2 µm. If the first coat is too thick, an increase of the performance of the tool cannot be observed, however, the probability that the coating chips off is increased. Furthermore, the duration of the process for manufacturing the coating is prolonged, which is an economical disadvantage. If the first coat is too thin, its function as a supporting coat for the second coat deposited on top will suffer. Particularly, if the first coat is too thin, it can no longer sufficiently reduce the effects of residual compressive stresses from the second coat on the adhesion of the coat.

In another preferred embodiment of the invention the second coat (2) consists of a sequence of 15 to 70, preferably 20 to 60 of each of the first layer (2a) and second layer (2b) being alternatingly deposited on top each other.

In another embodiment of the invention each of the first and second layers (2a, 2b) of the second coat (2) has a layer thickness of 10 nm to 60 nm, preferably of 20 nm to 50 nm.

The second coat (2) preferably has a coating thickness of 0.5 µm to 10 µm, particularly preferred 2 µm to 6 µm. If the second coat is too thick, an increase of the performance of the tool cannot be observed, however, the probability that the coat chips off is increased, and the process duration for the manufacturing of the coat is prolonged, which results in economical disadvantages. If the second coat is too thin, it will wear more rapidly.

In another embodiment of the invention, the wear protection coating comprises a third coat (3) deposited above the second coat (2). This can be a thin hard material coat being provided as a decorative coat and/or as a wear indicating coat having a thickness of from 0.05 µm to 1 µm, preferably 0.1 µm to 0.5 µm. Particularly preferably such a third coat (3) has the composition $Ti_bSi_{(1-b)}N$ wherein $0.70 \leq b \leq 0.98$.

In another embodiment of the invention, the first layer (2a) of the second coat (2) comprises 2 to 20, preferably 3 to 10, of each of alternatingly on top of each other deposited sub-layers having the compositions $Ti_ySi_{(1-y)}N$ and $Al_zCr_{(1-z)}N$, respectively, wherein $0.70 \leq y \leq 0.98$ and $0.6 \leq z \leq 0.8$ and wherein the thickness of each of the sub-layers is 0.5 nm to 15 nm.

Preferably the sub-layers of the compositions $Ti_ySi_{(1-y)}N$ and $Al_zCr_{(1-z)}N$, respectively, from which the first layer (2a) is preferably made, have cubic face-centered crystal structure verifiable in the X-ray diffractogram. It is self-evident for the skilled person that it is not possible to produce X-ray diffractograms in an isolated manner from individual sub-layers of the compositions $Ti_ySi_{(1-y)}N$ and $Al_zCr_{(1-z)}N$ that are only a few nanometers thin or from individual first layers (2a) that are also only a few nanometers thin. Therefore, if it is herein indicated that the sub-layers of the compositions $Ti_ySi_{(1-y)}N$ and $Al_zCr_{(1-z)}N$ have cubic face-centered crystal structure verifiable in the X-ray diffractogram, then this was measured across the entire assembly of layers, and there was observed only the cubic face-centered crystal structure, but no other structures, such as for example the hexagonal crystal structure.

It was found that a first layer (2a) having the cubic face-centered crystal structure in the inventive tool exhibits particularly high hardness and strength compared to layers having other crystal structures, which is advantageous to the performance of the tool. It is assumed that this advantage results from a particularly high space density within the crystal structure. It is further assumed that the advantages of the layer also result from the fact that the cubic lattice provides numerous sliding planes on which the atomic layers can slide relative to each other without the general structure of the crystal lattice being permanently disturbed, so that the crystal can undergo plastic deformation within certain limits without getting destroyed.

In another embodiment of the invention, the cutting edges of the tool are provided with a cutting edge rounding having a radius within the range of from 10 to 100 µm, preferably 20 to 60 µm. If the cutting edge radius is too low, there is the danger that the edge rapidly breaks. A too high cutting edge radius results in very high cutting forces that have disadvantageous effects on the service life of the tool and on the shapes of the chips.

In another embodiment of the invention, the inventive wear protection coating has a Vickers hardness HV of from 3000 to 4500, preferably 3300 to 4000. The high hardness of the inventive coating has particular advantages in metal machining, especially in drilling, but also in turning and milling, because among the separating procedures using a geometrically determined cutting edge these machining operations are the ones with the highest demands on the cutting material with respect to hardness, toughness, wear resistance and temperature resistance. A too low hardness has the disadvantage that the wear resistance of the coating decreases. A too high hardness has the disadvantage that the toughness of the coating decreases and the coating becomes brittle, and especially the integrity of the cutting edge is vulnerable.

In another embodiment of the invention, the inventive wear protection coating has a modulus of elasticity (E-modulus) of >380 GPa, preferably of >420 GPa. During stressing of the tool from the outside in the chipping operation, mechanical stresses are generated in the coating and in the substrate, the amount of which is related to the introduced elastic deformation through the modulus of elasticity. If the modulus of elasticity of the coating is too low, low stresses are generated in the coating during mechanical deformation of the tool in use, which goes along with the disadvantage that the coating can only absorb a low portion of the chipping forces. However, if the modulus of elasticity is too high, this has the disadvantage that under mechanical deformation too high forces are deflected through the coating, which can lead to its early destruction.

Particularly for drilling, turning and milling, the combination of high hardness and high modulus of elasticity are particularly advantageous. The high hardness results in high wear resistance. However, high hardness usually goes along with increased brittleness. At the same time, the high modulus of elasticity makes that the material exhibits a lower brittleness and that it can better compensate for high mechanical loads. By the inventive coating sequence the entire wear protection coating of the tool is provided with these advantageous properties.

In another preferred embodiment of the inventive tool, the wear protection coating has an average surface roughness Ra of ≤1.0 µm, preferably ≤0.5 µm, measured along a length of 10 µm. Through applying the inventive process and the inventive coating sequence, as well as a suitable choice of deposition parameters in the PVD process, one can achieve a significant reduction of the droplet frequency of the deposited coats, whereby already the as-deposited coating receives a low average surface roughness Ra. Therefore, significantly reduced effort during the subsequent smoothing procedure of the surface is sufficient after coating to achieve an optimum condition for machining. Known blasting methods, grinding or brushing methods with correspondingly hard and fine materials are suitable for smoothing the surface of the tool after deposition of the coats.

A suitable process for smoothing the surface of the tool is, for example, wet blasting with glass beads at a pressure of approximately 2.5 bars with a blasting medium consisting of 50% glass beads having a diameter of 70-110 µm and 50% glass beads having a diameter of 40-70 µm. The appropriate blasting duration is determined by examining the desired surface smoothness. The processing time in the case of a solid hard metal milling tool having a diameter of 10 mm is, for example, approximately 10 seconds.

A further suitable method for smoothing the surface of the tool is drag finishing. A suitable abrasive is, for example, a coconut shell granulated material with fine diamond powder as abrasive and adhesive oil.

Also, the wet blasting using corundum with, for example, a grit size of 280/320 and a blasting abrasive concentration in the liquid of approximately 18% is particularly suitable for a post-treatment. Here, a blasting pressure of approximately 1.5 to 2 bars is expediently used, the blasting direction and angle being set subject to the type and size of tool.

In a further embodiment of the invention, the tool has a base body of hard metal, wherein the hard metal comprises preferably 5 to 15 at-%, particularly preferably 7 to 12 at-% Co, 0 to 2 at-%, particularly preferably 0.5 to 1.5 at-% Cr, 0 to 3 at-%, particularly preferably 0.5 to 2 at-% carbide, nitride, carbonitride, oxycarbide, oxynitride and/or oxycarbonitride of the elements of the subgroups 4A, 5A and 6A of the periodic table, and balance WC.

Hard metals of these compositions have turned out to be particularly useful as substrate materials for the production of tools for milling and drilling of iron materials. For these applications, they exhibit a particularly advantageous ratio of hardness and toughness, and thus, good resistance against crack formation and crack propagation.

The Cr content leads to a limitation of the grain growth during sintering of the hard metal. In tools for the aforementioned applications, milling and drilling of iron materials, the WC grain size should be low compared to the dimensions of the cutting edges to also herein achieve a balanced relationship between toughness and hardness, but also the ability of the tool to endure the failure of individual grains without an immediate failure of the tool. Generally, the WC grain sizes of the hard metals of solid hard metal drills should be smaller than in hard metals used for indexable cutting inserts.

Advantageously, the inventive tool is designed as a solid hard metal drill or as an indexable cutting insert, preferably as an indexable drilling cutting insert. Furthermore, the inventive tool has particular advantages in drilling operations of tough iron materials, preferably ISO-P materials, ISO-K materials and ISO-M materials, especially ISO-K materials (cast materials), as discussed above.

The invention also includes a process for manufacturing of the inventive tool, wherein a multilayer wear protection coating is deposited on a base body of hard metal, cermet, ceramics, steel or high-speed steel in the PVD process, preferably by arc vapor deposition, wherein (a) on the surface of the base body a first coat (1) is deposited having the composition TiAlN wherein $0.4 \leq a \leq 0.6$ and a coating thickness of from 0.5 µm to 4 µm, (b) on the first coat (1), a second coat (2) is deposited of a sequence of 5 to 100 of each of alternatingly on top of each other deposited first layers (2a) and second layers (2b) with a thickness of each of the first and second layers (2a, 2b) of from 5 nm to 100 nm, wherein the deposition of the first layers (2a) is effected by the deposition of alternatingly on top of each other arranged sub-layers having the compositions $Ti_y Si_{(1-y)}N$ and $Al_z Cr_{(1-z)}N$, respectively, wherein $0.70 \leq y \leq 0.98$ and $0.6 \leq z \leq 0.8$ and with a thickness of each of the sub-layers from 0.5 nm to 15 nm, and wherein the second layer (2b) has the composition $Ti_x Al_{(1-x)}N$ wherein $0.4 \leq x \leq 0.6$.

In a preferred embodiment of the inventive process, above the second coat (2) there is deposited a third coat (3) having the composition $Ti_b Si_{(1-b)}N$ wherein $0.70 \leq b \leq 0.98$ and with a thickness of 0.05 µm to 1 µm, preferably 0.1 µm to 0.5 µm.

The inventive process further comprises that, after the deposition of the wear protection coating, the tool is preferably subjected to one or more post-treatment steps, wherein a) at least the main cutting edges of the tool are subjected to a cutting edge rounding by brushing, and/or b) the surface of the rake face or of the flute is smoothened by abrasive wet blasting, preferably by abrasive wet blasting using corundum particles, and/or c) the surface of the rake face or of the flute is smoothened by abrasive or compacting dry-blasting, preferably by abrasive dry-blasting using corundum particles or by compacting dry-blasting using zirconium oxide beads, and/or d) the surface of the rake face or of the flute is smoothened by drag finishing, and/or e) the tool is wet-chemically cleaned.

Finally, the invention also includes the use of the inventive tool for the drilling of metal materials, preferably ISO-P materials (tough iron materials, unalloyed and low alloyed steels) and ISO-K materials (cast iron), but also ISO-M materials (stainless steels).

FIGURES

FIG. 1 shows a schematic representation of an inventive coating on a base body 4 of hard metal, cermet, ceramics, steel or high-speed steel and of a multi-layer wear protection coating deposited on the base body in the PVD process and made of a first coat 1, a second coat 2 consisting of a sequence of first layers 2a and second layers 2b alternatingly arranged on top of each other, and a hard material coat 3 which is herein formed as a covering coat. The circle designated "A" in the upper representation of FIG. 1 characterizes a detail enlargedly shown in the lower representation of FIG. 1 of essentially the first layer 2a consisting of TiSiN sub-layers and AlCrN sub-layers, respectively, that are alternatingly arranged on top of each other and are herein designated "TiSiN-Sub" and "AlCrN-Sub", respectively.

Figure 2:
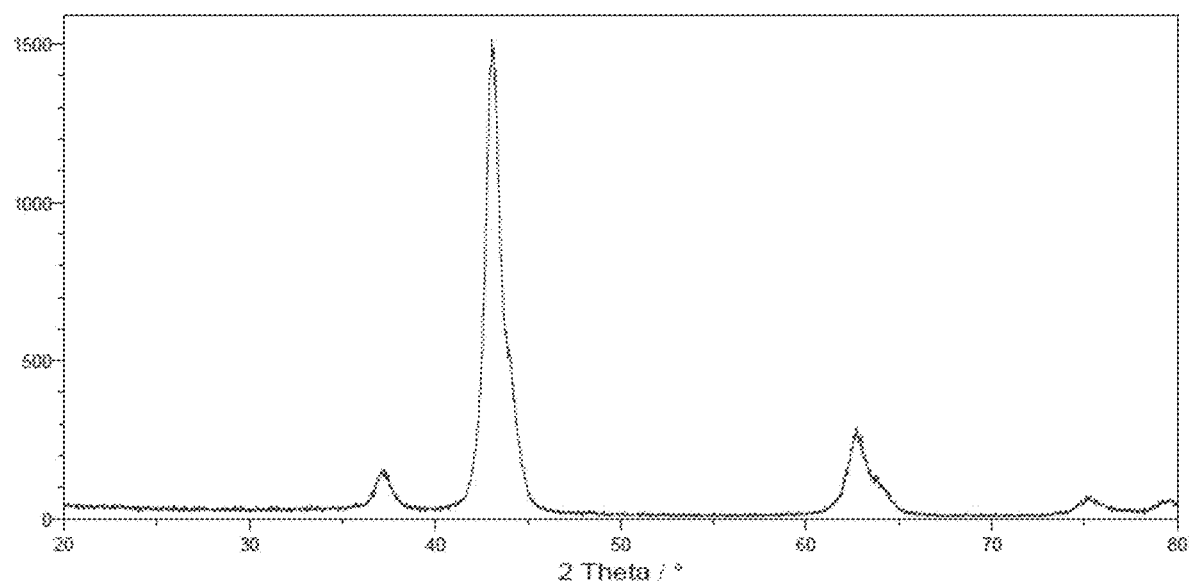

FIG. 2 shows a X-ray diffractogram of the inventive coating ERF2 described in the examples, the X-ray diffractogram being recorded in Bragg-Brentano geometry (theta-2 theta). The measured reflections exactly correspond to what is expected for a pure cubic crystal structure.

DEFINITIONS AND METHODS

Measurements of Hardness and E-modulus

Hardness and E-modulus (more precisely so-called reduced E-modulus) are measured by nano indentation. In this measurement, a diamond test body according to Vickers is pressed into the layer and the force-path curve is recorded during the measurement. From this curve, it is then possible to calculate the mechanical characteristic values of the test body, inter alia hardness and (reduced) E-modulus. To determine the hardness and E-modulus of the layer according to the invention, a Fischerscope® Picodentor HM500 XYp manufactured by Helmut Fischer GmbH, Sindelfingen, Germany was used. It should be noted that the impression depth should not be more than 10% of the layer thickness, otherwise characteristics of the substrate can falsify the measurements. The measurements have been carried out using a test load of 15 mN. In a first step, the test load is applied within 20 seconds in a linearly ascending manner, then the test load is maintained for 10 seconds, and in a third step, the test load is again reduced to zero within 20 seconds, and the test body is lifted off.

Measurement of the Surface Roughness

The surface roughness was measured on polished test surfaces using a measuring device Hommel-ETAMIC TURBO WAVE V7.32 manufactured by HOMMEL ETAMIC GmbH, Schwenningen, Germany (probe: TKU300-96625_TKU300/TS1; measuring range: 80 µm; test path: 4.8 mm; speed: 0.5 mm/s).

EXAMPLES

Example 1

Production of Inventive Tools and Comparative Tools

In this example, substrates for solid hard metal (SHM) drills (SUB1), as well as for hard metal indexable cutting inserts (SUB2) were provided with inventive coatings and comparative coatings of the prior art.

Specification of the Solid Hard Metal (SHM) Drill (SUB1)

Diameter: 8.5 mm
Nominal drilling depth: 5×d
Number of cutting edges: 2
Length of cutting edges: 50% of the diameter
Spiral angle of the flutes: about 30°
Tip angle: 140°
Substrate material: hard metal comprising 90 at-% WC, 9.2 at-% Co and 0.8 at-% Cr and having an average WC grain size of 0.7 µm Specification of the Hard Metal Indexable Cutting Inserts (SUB2)

Geometry: P6001
Substrate material: hard metal comprising 88 at-% WC, 10.5 at-% Co and 1.5 at-% mixed carbides (TiC, TaC and NbC) and having an average WC grain size of about 5 µm Specification of the Holder for the Hard Metal Indexable Cutting Inserts (SUB2)

Diameter: 18 mm
Nominal drilling depth: 5×d
Number of cutting edges: 2
Length of cutting edges: 50% of the diameter
Spiral angle of the flutes: about 20°
Tip angle: 140°

Pre- and Post-treatments of the Substrate

Prior to the coating of the substrates, the main cutting edges were subjected to cutting edge rounding to a radius of 20-60 μm by brushing, the flutes were smoothened by wet-blasting using corundum, and the substrate was wet-chemically cleaned. After the coating of the substrates, the flutes were smoothened by wet-blasting using corundum. The pre- and post-treatments were carried out in the same way with the tools coated according to the invention, as well as with the comparative tools.

Manufacturing of an Inventive Coating (ERF1 and ERF2)

The entire coating was deposited by arc vapor deposition in a single run without interruption of the deposition process.

First Coat: First, a 1.7 μm thick, single-layer first TiAlN coat (1) was deposited on the substrate surface from two TiAl mixed targets (Ti:Al=50:50) (Bias: 50 V DC; 4 Pa nitrogen; 160 A evaporator current each; deposition temperature: 550° C.).

Second Coat: Above the first coat a multi-layer second coat (2) was deposited, consisting of a sequence of 40 of each of first layers (2a) of TiAlCrSiN and second layers (2b) of TiAlN alternatingly arranged on top of each other.

Each of the first TiAlCrSiN layers (2a) consisted of 4 TiSiN sub-layers and 4 AlCrN sub-layers alternatingly deposited on top of each other. The TiSiN sub-layers were deposited from two TiSi mixed targets (Ti:Si=85:15), and the AlCrN sub-layers were deposited from two AlCr mixed targets (Al:Cr=70:30) (Bias: 60 V DC; 4 Pa nitrogen; 160 A evaporator current each; deposition temperature 550° C.). The thickness of the individual sub-layers was about 5 nm so that each of the first TiAlCrSiN layers (2a) had a thickness of about 40 nm.

The second TiAlN layers (2b) were deposited from two Ti-Al mixed targets (Ti:Al=50:50) (Bias: 60 V DC; 4 Pa nitrogen; 160 A evaporator current each; deposition temperature 550° C.). The thickness of each of the second TiAlN layers (2b) was about 40 nm.

Third Coat: For a first inventive coating (ERF1) a single-layer third TiSiN coat (3) was deposited above the second coat as a decorative coat having a thickness of 0.2 μm from two Ti-Si mixed targets (Ti:Si=85:15) (Bias: 30 V DC; 3.5 Pa nitrogen; 180 A evaporator current each; deposition temperature 480° C.). For the deposition of this coat the deposition temperature was selected slightly lower than for the previous coats to accelerate the cooling process and to shorten the total process time a little bit.

A second inventive coating (ERF2) comprised only the first coat (1) and the second coat (2), but not the third coat (3). For measurements on the second coat (2), for example, hardness measurements or X-ray structure analysis, coated tools having the second inventive coating (ERF2) were used, having only the first coat (1) and the second coat (2) deposited thereon, but not the third coat (3). For machining tests there is individually indicated which one of the inventive coatings was used (ERF1 or ERF2).

The deposition temperature in the PVD process has a significant influence on the cleanliness of the substrate prior to the coating. The higher the temperature is, the more impurities on the tool from previous operation steps are removed or simply evaporated, respectively. For substrates made of HSS steel the deposition temperatures are often a compromise between good cleaning and avoidance of thermal damages to the substrate. For hard metal substrates it is not required to enter into such compromises.

Manufacturing of Comparative Coatings (VGL1, VGL2 and VGL3)

Comparative Coating 1 (VGL1):

On the substrate surface there was first deposited a primer layer system for the improvement of the adhesion, the system consisting of a TiN layer and a TiAlN layer. The TiN layer was deposited from two Ti targets (Bias: 200 V DC; 0.8 Pa nitrogen; 180 A evaporator current each; deposition temperature: 450° C.). The thickness of the TiN layer was about 100 nm. The TiAlN layer was deposited from two Ti-Al mixed targets (Ti:Al=50:50) and two Ti targets (Bias: 40 V DC; 3.2 Pa nitrogen; 200 A evaporator current (Ti targets), 210 A evaporator current (TiAl targets); deposition temperature: 450° C.). The thickness of the TiAlN layer was about 40 nm.

Subsequently, a multi-layer coat of a sequence of 11 of each of layers consisting of TiAlN and TiN was deposited alternatingly on top of each other. The TiAlN layers were deposited from two Ti-Al mixed targets (Ti:Al=50:50) and two Ti targets, and the TiN layers were deposited from two Ti targets (Bias: 40 V DC; 3.2 Pa nitrogen; 200 A evaporator current (Ti targets), 210 A evaporator current (TiAl targets); deposition temperature: 450° C.). The thickness of each of the TiAlN layers was about 200 nm, and the thickness of each of the TiN layers was about 100 nm, so that the coating had a total thickness of about 3,300 nm.

A coat of TiAlN having a higher Al content was deposited as a covering layer from two Ti targets (Bias: 40 V DC; 3.2 Pa nitrogen; 210 A evaporator current; deposition temperature: 450° C.). The thickness of the TiAlN layer was about 500 nm.

Comparative Coating 2 (VGL2):

On the substrate surface there was first deposited a primer layer to improve the adhesion. The parameters for this primer layer were: 4 AlCr mixed targets (Al:Cr=70:30); evaporator current: 160 A each; pressure: 3.5 Pa nitrogen; 50 V DC Bias; temperature: 480° C.; layer thickness: about 100 nm.

Subsequently, a multi-layer coat of a sequence of 10 of each alternatingly on top each other deposited layers of TiSiN and AlCrN were deposited. Each of these layers consisted of 4 sub-layers. The first sub-layer was produced from two TiSi mixed targets (Ti:Si=85:15) with a an evaporator current of 180 A, and from 4 AlCr mixed targets (Al:Cr=70:30) with an evaporator current of 150 A. The remaining parameters were: pressure: 3.5 Pa nitrogen; 30 V DC Bias; temperature: 480° C.; sub-layer thickness: about 50 nm. The second sub-layer was produced from two TiSi mixed targets (Ti:Si=85:15) with an evaporator current of 180 A. The remaining parameters were: pressure: 3.5 Pa nitrogen; Bias: 30 V DC; temperature: 480° C.; sub-layer thickness: about 50 nm. The third sub-layer had the same structure and the same coating thickness as the first layer. The fourth sub-layer was produced using 4 AlCr mixed targets (Al:Cr=70:30). The parameters were: evaporator current: 160 A; pressure: 3.5 Pa nitrogen; Bias: 40 V DC; temperature: 480° C.; sub-layer thickness: about 200 nm.

In addition, a covering layer was deposited on the multi-layer system. The parameters for this covering layer were: 2 TiSi mixed targets (Ti:Si=85:15); evaporator current: 180 A each; pressure: 3.5 Pa nitrogen; Bias: 30 V DC; temperature: 480° C.; layer thickness: about 300 nm.

Comparative Coating 3 (VGL3):

The comparative coating 3 (VGL3) was a combination of the comparative coatings 1 and 2. First, a comparative coating 1 (VGL1) was deposited on the substrate surface according to the above-described method. Subsequently, the coated substrate body was cooled down, removed from the coating reactor, smoothened in the flute by wet-blasting, and finally reintroduced into the coating reactor to deposit a comparative coating 2 (VGL2) according to the above-described method.

Mechanical Properties of the Coatings

Hardness and E-modulus of the inventive coating ERF2 (without the third coat (3)), as well as of the comparative coatings VGL1 and VGL2 were measured, as described above, and are indicated in the following table 1.

Furthermore, the maximum operating temperature of the coated tools was estimated on the basis of literature indications. In many cases of operation, known TiAlN coatings have an operating temperature of a maximum of 900° C.

TABLE 1

| Coating | Hardness [HV] | E-modulus [GPa] | Max. operating temperature [° C.] |
|---|---|---|---|
| ERF2 | 3600 HV | 460 GPa | about 1000° C. |
| VGL1 | 3000 HV | 430 GPa | about 700° C. |
| VGL2 | 3600 HV | 440 GPa | about 1000° C. |

Example 2

Machining Tests

Tools produced according to example 1 were compared in machining tests (drilling).

Machining Test 1

Using solid hard metal drills (SUB1) having the coatings ERF2, VGL1, VGL2 and VGL3, respectively, blind holes of a depth of 18 mm were produced in an alloyed steel material, 42 CrMo4 (1.7225 according to EN10027-2) having a strength of 850 N/mm² ($v_c$=120 m/min; f=0.23 mm/U; internal cooling with KSS 5% and 20 bars).

The machining was terminated at an average flank wear of $V_b$>0.2 mm or a maximum flank wear $V_{bmax}$>0.25 mm, and the tool life distance reached until then was determined. The results are indicated in the following table 2 as the average tool life distance of three tests.

TABLE 2

| Substrate/Coating | Average tool life distance [m] |
|---|---|
| SUB1/ERF2 | 32 |
| SUB1/VGL1 | 10 |
| SUB1/VGL2 | 15 |
| SUB1/VGL3 | 22 |

Tools having the inventive coating reached significantly higher average tool life distances than the tools with the comparative coatings.

Machining Test 2

Using solid hard metal drills (SUB1) having the coatings ERF2 and VGL3, respectively, blind holes of a depth of 40 mm were produced in an unalloyed steel material (C45E according to EN10020, corresponding to Ck 45 according to DIN 17200) having a strength of 600 N/mm² ($v_c$=175 m/min; f=0.3 mm/U; internal cooling with KSS 5% and 20 bars).

The machining was terminated at an average flank wear of $V_b$>0.2 mm or a maximum flank wear $V_{bmax}$>0.25 mm, and the tool life distance reached until then was determined. The results are indicated in the following table 3 as the average tool life distance of three tests.

TABLE 3

| Substrate/Coating | Average tool life distance [m] |
|---|---|
| SUB1/ERF2 | 104 |
| SUB1/VGL3 | 89 |

Tools having the inventive coating reached significantly higher average tool life distances than the tools with the comparative coatings. The variation among the results of the tools coated according to the invention was also lower than for the comparative tools.

Machining Test 3

Using indexable cutting inserts (SUB2) having the coatings ERF2 and VGL3 as well as the above-described holder, blind holes of a depth of 52 mm were produced in an cast iron material (EN-GJL-250 to EN1561, corresponding to GG25 according to DIN 1691) ($v_c$=160 m/min; f=0.28 mm/U; internal cooling with KSS 5% and 20 bars).

The machining was terminated at an average flank wear of $V_b$>0.3 mm or a maximum flank wear $V_{bmax}$>0.4 mm, and the tool life distance reached until then was determined. The results are indicated in the following table 4 as the average tool life distance of three tests.

TABLE 4

| Substrate/Coating | Average tool life distance [m] |
|---|---|
| SUB2/ERF2 | 68 |
| SUB2/VGL3 | 64 |

Tools having the inventive coating reached significantly higher average tool life distances than the tools with the comparative coatings.

Machining Test 4

Using solid hard metal drills (SUB1) having the coatings ERF, ERF2 and VGL3, respectively, blind holes of a depth of 20 mm were produced in an unalloyed steel material (C45E according to EN10020, corresponding to Ck 45 according to DIN 17200) having a strength of 600 N/mm² ($v_c$=170 m/min; f=0.3 mm/U; internal cooling with KSS 5% and 20 bars).

The machining was terminated at an average flank wear of $V_b$>0.25 mm or a maximum flank wear $V_{bmax}$>0.3 mm, and the tool life distance reached until then was determined. The results are indicated in the following table 5.

TABLE 5

| Substrate/Coating | Average tool life distance [m] |
|---|---|
| SUB1/ERF2 | 80 |
| SUB1/ERF1 | 87 |
| SUB1/VGL1 | 29 |

Tools having the inventive coating reached significantly higher average tool life distances than the tools with the comparative coatings. The variation among the results of the tools coated according to the invention was also lower than for the comparative tools, especially for the tools with inventive coating ERF1.

The invention claimed is:
1. A tool comprising:
a base body selected from hard metal, cermet, ceramics, steel and high speed steel; and
a multi-layer wear protection coating deposited on the base body by a PVD process, wherein the wear protection coating includes a first coat deposited on the base body and having the composition $Ti_aAl_{(1-a)}N$, wherein $0.4 \le a \le 0.6$ and a coating thickness of 0.5 µm to 4 µm, a second coat deposited on the first coat and including a sequence of 10 to 80 of each of first layers and second layers alternatingly arranged on top of each other, wherein each of the first and second layers has a layer thickness of from 5 nm to 100 nm, wherein the first layer includes nitrides of elements Ti, Al, Cr and Si, the first layer has a cubic face-centered crystal structure verifiable in an X-ray diffractogram, and wherein the second layer has a composition of $Ti_aAl_{(1-x)}N$, wherein $0.4 \le x \le 0.6$, and at least one further hard material coat disposed above the second coat, and wherein the first and second coats due to the manufacturing method include up to 10 at -% of metals, B, C and/or O as impurities in each layer.

2. The tool according to claim 1, wherein the PVD process is arc vapor deposition.

3. The tool according to claim 1, wherein the first coat includes a single-layer and/or has a layer thickness within the range of from 1 to 3 µm.

4. The tool according to claim 1, wherein the second coat has a sequence of 15 to 70 of each of the first layers and the second layers alternatingly arranged on top of each other, and/or each of the first and second layers of the second coat having a layer thickness of 10 nm to 60 nm, and/or the second coat having a coating thickness of from 0.5 µm to 10 µm.

5. The tool according to claim 1, wherein the wear protection coating includes a third coat deposited above the second coat and having the composition $Ti_bSi_{(1-b)}N$ wherein $0.70 \le b \le 0.98$ and having a thickness of from 0.05 µm to 1 µm.

6. The tool according to claim 1, wherein the first layer of the second coat includes 2 to 40 of alternatingly, on top of each other, deposited sub-layers of the compositions $Ti_ySi_{(1-y)}N$ and $Al_zCr_{(1-z)}N$, respectively, wherein $0.70 \le y \le 0.98$ and $0.6 \le z \le 0.8$ and having a thickness of each of the sub-layers of from 0.5 nm to 15 nm.

7. The tool according to claim 1, wherein cutting edges of the tool are provided with a cutting edge rounding of a radius within the range of from 10 to 100 µm.

8. The tool according to claim 1, wherein the wear protection coating has a Vickers hardness HV of from 3000 to 4500, and/or a modulus of elasticity (E-modulus) of >380 GPa,.

9. The tool according to claim 1, wherein the wear protection coating has an average surface roughness Ra, measured along a length of 10 µm, of $\le 1.0$ µm.

10. The tool according to claim 1, wherein the base body made of hard metal includes 5 to 15 at-% Co, 0 to 2 at-% Cr, 0 to 3 at-% carbide, nitride, carbonitride, oxycarbide, oxynitride and/or oxycarbonitride of the elements of the sub-groups 4A, 5A and 6A of the periodic system, and balance of WC.

11. The tool according to claim 1, wherein the tool is a solid hard metal drill, an indexable cutting insert, an indexable drilling cutting insert for the machining of iron materials selected from ISO-P materials, ISO-K materials and ISO-M materials.

12. A process for manufacturing of a tool comprising:
providing a base body made of hard metal, cermet, ceramics, steel or high-speed steel;
depositing a multi-layer wear protection coating on the base body by a PVD process, such as an-arc vapor deposition, wherein on a surface of the base body a first coat is deposited, the first coat having a composition TiAlN, wherein $0.4 \le a \le 0.6$ and a coating thickness of from 0.5 µm to 4 µm, the first coat having a cubic face-centered crystal structure verifiable in an X-ray diffractogram; and
depositing on the first coat, a second coat having a sequence of 5 to 100 of each of alternatingly, one on top of each other first layers and second layers, a thickness of each of the first and second layers being of from 5 nm to 100 nm, wherein the deposition of the first layers is effected by the deposition of alternatingly, on top of each other, arranged sub-layers having the compositions $Ti_ySi_{(1-y)}N$ and $Al_zCr_{(1-z)}N$, respectively, wherein $0.70 \le y \le 0.98$ and $0.6 \le z \le 0.8$ and with a thickness of each of the sub-layers being from 0.5 nm to 15 nm, and wherein the second layer has the composition $Ti_xAl_{(1-x)}N$ wherein $0.4 \le x \le 0.6$.

13. The process of claim 12, further comprising depositing a third coat above the second coat, the third coat having the composition $Ti_bSi_{(1-b)}N$, wherein $0.70 \le b \le 0.98$ and with a thickness of from 0.05 µm to 1 µm.

14. The process of claim 12, wherein, after the deposition of the wear protection coating, the tool is subjected to one or more post-treatment steps, wherein at least main cutting edges of the tool are subjected to cutting edge rounding by brushing, and/or a surface of the rake face or of a flute is smoothened by abrasive wet-blasting and/or by abrasive or compacting dry-blasting, and/or by drag finishing, and/or wherein the tool is wet-chemically cleaned.

* * * * *